(12) United States Patent
Vercesi et al.

(10) Patent No.: US 12,297,099 B2
(45) Date of Patent: May 13, 2025

(54) PROCESS FOR MANUFACTURING A COMBINED MICROELECTROMECHANICAL DEVICE AND CORRESPONDING COMBINED MICROELECTROMECHANICAL DEVICE

(71) Applicant: STMICROELECTRONICS S.r.l., Agrate Brianza (IT)

(72) Inventors: Federico Vercesi, Milan (IT); Luca Seghizzi, Milan (IT); Laura Oggioni, Milan (IT); Lorenzo Corso, Ruginello (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 475 days.

(21) Appl. No.: 17/744,312

(22) Filed: May 13, 2022

(65) Prior Publication Data
US 2022/0380203 A1 Dec. 1, 2022

(30) Foreign Application Priority Data
May 26, 2021 (IT) .......................... 102021000013718

(51) Int. Cl.
*B81B 7/02* (2006.01)
*B81B 7/00* (2006.01)

(52) U.S. Cl.
CPC .............. *B81B 7/02* (2013.01); *B81B 7/0058* (2013.01); *B81B 2201/0264* (2013.01); *B81B 2203/0127* (2013.01)

(58) Field of Classification Search
None
See application file for complete search history.

(56) References Cited

U.S. PATENT DOCUMENTS

| 9,919,919 | B2 | 3/2018 | Frey et al. | |
|---|---|---|---|---|
| 10,017,380 | B1 | 7/2018 | Stadler et al. | |
| 2016/0023891 | A1* | 1/2016 | Reinmuth | B81B 7/0041 257/419 |
| 2016/0033273 | A1* | 2/2016 | Kamisuki | H05K 5/066 73/504.12 |
| 2016/0229687 | A1* | 8/2016 | Wen | B81B 7/02 |
| 2017/0158489 | A1* | 6/2017 | Breitling | B81B 7/0038 |

FOREIGN PATENT DOCUMENTS

WO 2015120939 A1 8/2015

* cited by examiner

*Primary Examiner* — Benjamin P Sandvik
(74) *Attorney, Agent, or Firm* — Seed IP Law Group LLP (57) ABSTRACT

A process for manufacturing a combined microelectromechanical device includes forming, in a die of semiconductor material, at least a first and a second microelectromechanical structure, performing a first bonding phase to bond a cap to the die via a bonding region or adhesive to define at least a first and a second cavity at the first and, respectively, second microelectromechanical structures, the cavities being at a controlled pressure, forming an access channel through the cap in fluidic communication with the first cavity to control the pressure value inside the first cavity in a distinct manner with respect to a respective pressure value inside the second cavity, and performing a second bonding phase, after which the bonding region deforms to hermetically close the first cavity with respect to the access channel.

20 Claims, 3 Drawing Sheets

PROCESS FOR MANUFACTURING A COMBINED MICROELECTROMECHANICAL DEVICE AND CORRESPONDING COMBINED MICROELECTROMECHANICAL DEVICE

BACKGROUND

Technical Field

The present disclosure relates to a process for manufacturing a combined microelectromechanical ("MEMS") device and to a corresponding combined microelectromechanical device.

Description of the Related Art

Combined MEMS devices are known and may include two microelectromechanical structures on the same substrate. The microelectromechanical structures of known combined MEMS devices may rely on different operating conditions, in particular as to different pressure values within the respective structures. For example, the pressure in one structure may be greater than the pressure in the other structure.

The aforementioned need to define different pressure values inside the respective structures in the combined MEMS device poses some implementation problems for the manufacturing process.

In this regard, a first known solution provides for the use of a getter region, which is introduced into one of the structures so as to adjust the pressure inside the same structure in a desired manner.

A second known solution, described for example in U.S. Pat. No. 10,017,380 B1 or in U.S. Pat. No. 9,919,919 B2, provides for the definition of a "chimney" or access channel through a structure at a location where adjustment of the pressure is desired.

However, both of the aforementioned known solutions suffer from disadvantages and have common problems associated with the difficulty in controlling the process spread and pressure set-points, as well as the complexity of the manufacturing process.

In particular, in the case of the first solution, the final value of the pressure at the location where the getter region is formed is affected by a series of factors, including the tolerance on the pressure set-point in the other cavities, the composition and concentration of the process gas, the activation of the getter and the ability to reduce the pressure inside the cavity.

Furthermore, the integration of the getter region into the manufacturing process flow increases the manufacturing complexity of the device.

In the case of the second solution, the hermetic closure of the access channel to maintain pressure requires complex additional operations, in particular as regards laser melting, which entail an increase in costs and times of the manufacturing process.

BRIEF SUMMARY

A combined MEMS device according to the present disclose may include at least a first and a second microelectromechanical structures, for example a first and a second detection structures defining a first and a second sensors, arranged in a same die of semiconductor material. Use of these combined MEMS devices is particularly advantageous, for example in terms of area occupation and optimization of electrical connections.

In particular, combined MEMS devices may define inertial measuring units, so-called IMU, comprising, in a same die of semiconductor material, a plurality of different sensors and with multiple sensing axes, for example at least one accelerometer and one gyroscope, both triaxial, so as to provide both acceleration and angular velocity information of a body or object, to which they are applied.

For example, these devices are widely used in mobile or wearable devices (such as smartphones, tablets, smartwatches or the like) or in automotive or industrial applications.

The accelerometer and gyroscope comprise respective movable structures, elastically suspended with respect to a common substrate formed in the die of semiconductor material and accommodated in a respective hermetic cavity, typically defined by bonding a cap to the same substrate.

In one or more embodiments, a process for manufacturing a combined microelectromechanical device is provided which overcomes the previously highlighted problems with conventional combined MEMS devices.

BRIEF DESCRIPTION OF THE SEVERAL VIEWS OF THE DRAWINGS

For a better understanding of the present solution, preferred embodiments thereof are now described, purely by way of non-limiting example, with reference to the attached drawings, wherein.

DETAILED DESCRIPTION

Figure 1A:
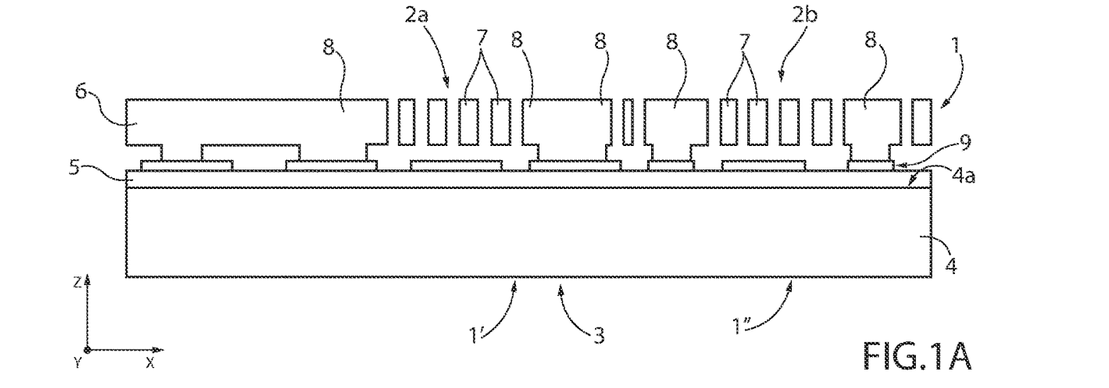
FIGS. 1A-1E are schematic cross-sectional views of successive steps in an embodiment of a manufacturing process for a combined microelectromechanical device according to the present disclosure.

As shown in FIG. 1A, the process for manufacturing a combined microelectromechanical (MEMS) device initially provides for forming a first and a second microelectromechanical structures $2a$, $2b$ in a die $1$ of semiconductor material, in particular silicon.

The first and second microelectromechanical structures $2a$, $2b$ are formed respectively in a first portion $1'$ and in a second portion $1''$ of the die $1$, distinct from each other and separated by a separation portion $3$. The separation portion $3$ may generally be located in the center of the die $1$ in a non-limiting example, although the location of the separation portion $3$ may be selected based on the size of the MEMS structures $2a$, $2b$.

In an embodiment, schematically illustrated in FIG. 1A, wherein the combined MEMS device defines an inertial measuring unit, the first microelectromechanical structure $2a$ is a detection structure defining a capacitive gyroscope, for example of a triaxial type; and the second microelectromechanical structure $2b$ is a detection structure defining a capacitive accelerometer, for example also of a triaxial type.

In particular, the die $1$ comprises a substrate $4$ having a top surface $4a$, with a dielectric layer $5$ formed thereon; the aforementioned first and second microelectromechanical structures 2a, 2b are formed above the top surface 4a of the substrate 4.

In the illustrated embodiment, the first and second microelectromechanical structures 2a, 2b comprise, defined in a same structural layer 6 above the substrate 4, respective suspended elements, schematically indicated with 7 (for example inertial masses, detection electrodes and/or actuation electrodes, elastic elements); these suspended elements 7 are coupled to respective anchoring elements 8, integral with respect to the substrate 4, also defined starting from the same structural layer 6.

Furthermore, a conductive layer 9, for example of polysilicon, is arranged and suitably shaped on the dielectric layer 5, so as to define suitable electrical connections between the first and second microelectromechanical structures 2a, 2b and contact pads, accessible from the outside of the combined microelectromechanical device (in a manner not illustrated here), for example for biasing of the same structures and the acquisition of corresponding detection signals.

Figure 1B:
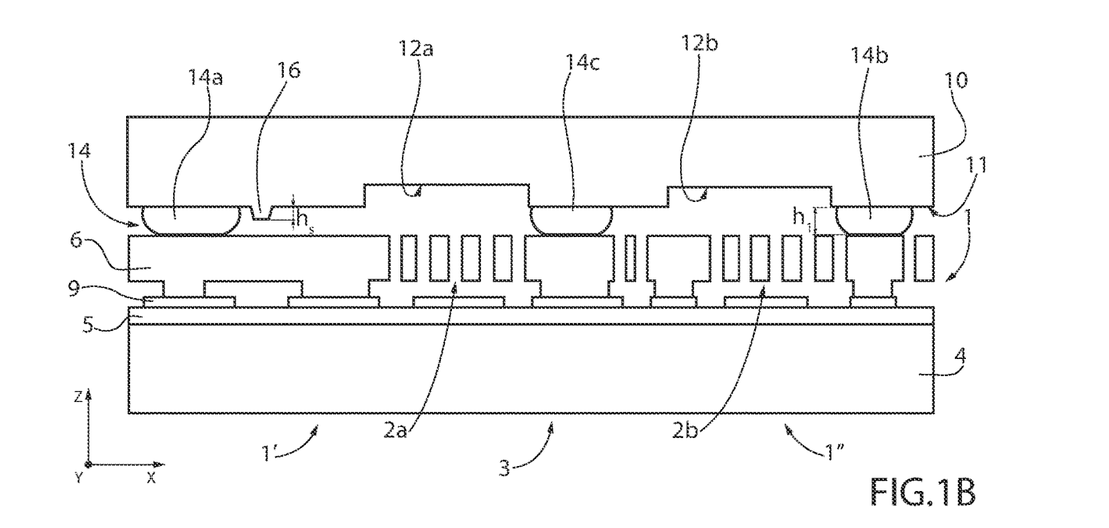

The aforementioned separation portion 3 of the die 1 comprises, in the illustrated example, a portion of the structural layer 6, interposed between respective anchoring elements 8 of the first and second microelectromechanical structures 2a, 2b. In FIG. 1A, the separation portion 3 may correspond to a central portion of the anchoring element 8 positioned between the first and second microelectromechanical structures 2a, 2b As shown in FIG. 1B, the manufacturing process also provides for the bonding of a cap 10 above the structural layer 6 of the die 1.

This cap 10 is processed so as to define a first and a second recess 12a, 12b in a surface 11 of the same cap 10 facing the structural layer 6 of the die 1. The surface 11 may also be referred to herein as a facing surface 11 of the cap 10.

In particular, the first recess 12a is placed at the first detection structure 2a, while the second recess 12b is placed at the second detection structure 2b.

A bonding region 14 (which may also be referred to herein as an adhesive 14), of a suitable material for ensuring a hermetic bonding, in particular of glass frit material, is bonded to the facing surface 11 of the cap 10 to couple the cap 10 to the structural layer 6.

In particular, this bonding region 14 comprises a first and a second bonding portions 14a, 14b (which may also be referred to herein as first and second adhesive portions 14a, 14b) arranged externally with respect to, and in proximity to, the first, and second detection structures 2a, 2b, respectively (similarly with respect to the first and the second portions 1', 1", respectively, of the die 1), and a third bonding portion 14c (which may also be referred to herein as a third adhesive portion 14c) arranged at the aforementioned separation portion 3 of the same die 1. The third bonding portion 14c is interposed between the first and the second bonding portions 14a, 14b along a first horizontal axis X of a horizontal plane XY that contains the facing surface 11.

In an embodiment, the bonding region 14 may define, in the horizontal plane XY, a ring around the first and the second recesses 12a, 12b, in this case the first and the third bonding portions 14a and 14c and the second and the third bonding portions 14b and 14c being connected to each other (in a manner not illustrated in FIG. 1B).

The bonding region 14 has a first or initial height $h_1$, along a vertical axis Z, transverse to the facing surface 11 of the cap 10 that lies in the horizontal plane XY. The first height $h_1$ is between the structural layer 6 and the facing surface 11 of the cap 10 in some embodiments, as shown in FIG. 1b.

As shown in the same FIG. 1B, a spacer or stop element (so-called "stopper") 16 may be coupled to the same facing surface 11 of the cap 10, for example in proximity to the first bonding portion 14a of the bonding region 14, having a second or separation height $h_s$ relative to the facing surface 11, less than the aforementioned initial height $h_1$.

The stopper element 16 may be integral with the cap 10 and be defined while defining the aforementioned first and second recesses 12a, 12b. The stopper element 16 may also be referred to herein as a protrusion 16 or protuberance 16 extending from the facing surface 11 of the cap by the separation height $h_s$.

Figure 1C:
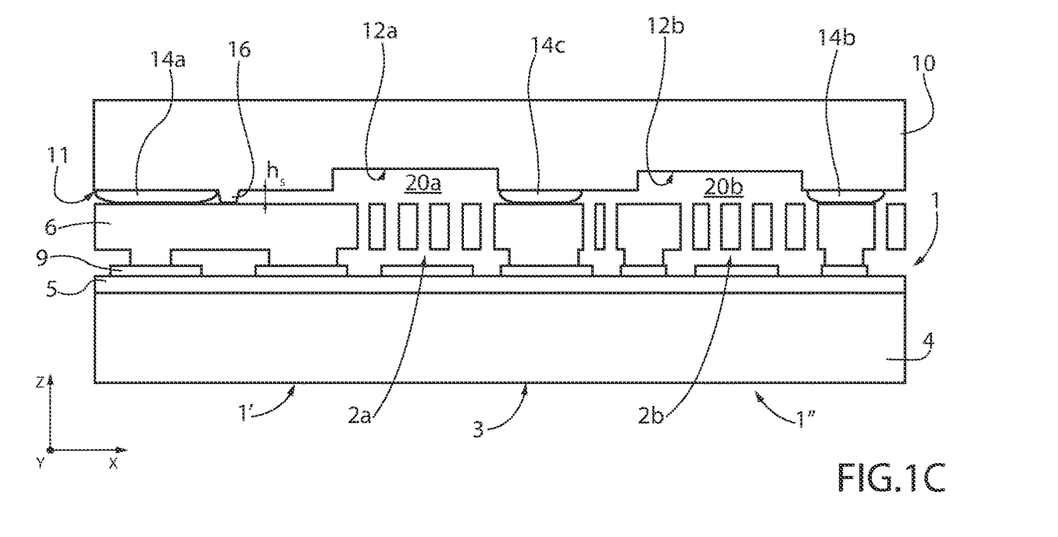

As shown in the aforementioned FIG. 1B and with reference to FIG. 1C, when the cap 10 is placed in contact with the die 1, with the bonding region 14 which is in contact with the structural layer 6 of the same die 1, there are defined, interposed between the same structural layer 6 and the facing surface 11 of the cap 10: a first cavity 20a, arranged at the first microelectromechanical structure 2a, laterally delimited (in the direction of the aforementioned first horizontal axis X) by the first and the third bonding portions 14a, 14c of the bonding region 14 and including the first recess 12a of the cap 10; and a second cavity 20b, arranged at the second microelectromechanical structure 2b, laterally delimited by the second and the third bonding portions 14b, 14c of the same bonding region 14 and including the second recess 12b of the aforementioned cap 10.

As shown in FIG. 1C, a first bonding phase (by thermocompression) is then performed, with a processing environment at a controlled pressure having a first value $P_1$, which corresponds for example to the desired operating pressure for the second microelectromechanical structure 2b (in this embodiment a high pressure suitable for the operation of the accelerometer, for example of the order of tens of mBar, for example equal to 100 mBar).

This first bonding phase entails a deformation, in particular a flattening or "squishing" (height reduction and widening) of the bonding region 14, due to the reflow of the bonding material, in particular glass frit under the first pressure $P_1$; the bonding region 14 therefore assumes an intermediate or third height $h_2$, less than the initial height $h_1$.

In the illustrated embodiment, this intermediate height $h_2$ corresponds to the separation height $h_s$ of the stopper element 16, which in fact defines in this case the separation distance between the cap 10 and the structural layer 6 of the die 1, at the end of the aforementioned first bonding phase. In other words, the pressure $P_1$ brings the separation element 16 in contact with the structural layer 6, as shown in FIG. 1C, thereby reducing the height of, and widening, the bonding region 14 from the initial height $h_1$ in FIG. 1B to the separation height $h_s$.

Figure 1D:
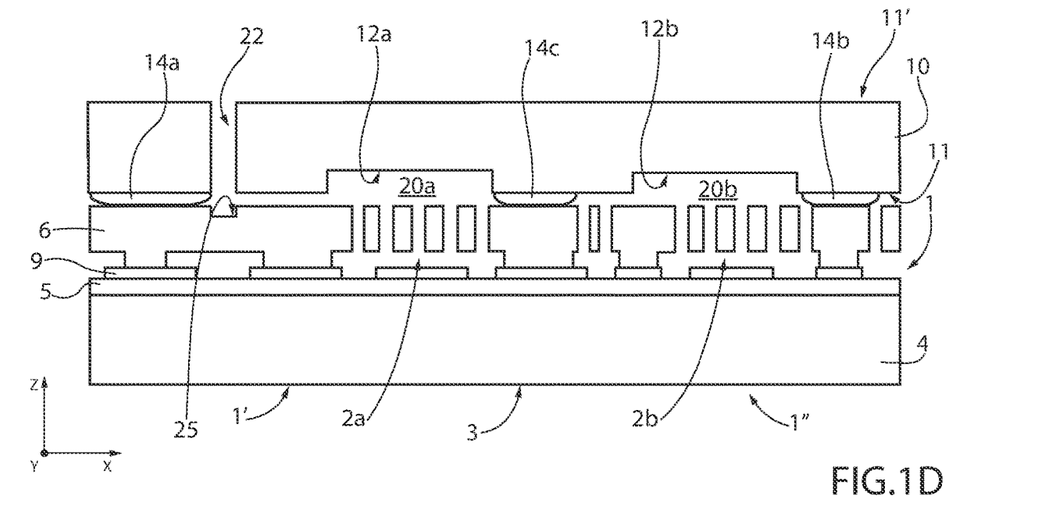

As shown in FIG. 1D, the manufacturing process provides for a possible thinning of the cap 10, from an outer surface 11' opposite to the facing surface 11. Subsequently, an etching of the same cap 10 is performed, from the outer surface 11' (possibly resulting from the thinning operation or from a separate and distinct operation) and in proximity to the first bonding portion 14a of the bonding region 14, internally with respect to the arrangement of the first recess 12a. The etching may be performed on the cap 10 between the first bonding region 14a and the first recess 12a.

This etching leads to the definition of an access channel 22, which extends entirely through the cap 10 (from the outer surface 11' to the facing surface 11), so as to be in fluidic communication with the first cavity 20a. In an embodiment, the access channel 22 may extend through the cap 10 in fluid communication with the second cavity 20b instead of the first cavity 20a with the corresponding aspects of the device (i.e., anchors 8, etc.) adapted to accommodate the access channel 22 proximate the second cavity 20b. In such an embodiment, the manufacturing process and resulting combined microelectromechanical device 30 may generally be the same as the processes and devices described herein, except for formation of the access channel 22 on the other side of the device 30 that is sealed by the second adhesive portion 14b.

In case the stopper element 16 has previously been formed, this etching is performed at this stopper element 16, such that the same stopper element 16 is completely removed following the etching.

As shown in the aforementioned FIG. 1D, the etching may possibly continue through a surface portion of the structural layer 6 of the die 1, in case, as in the example illustrated, an etch stop layer has not previously been formed, thereby causing the formation of an indentation 25, vertically at the aforementioned access channel 22.

The pressure inside the first cavity 20a is then adjusted in a suitable manner through the access channel 22, for example by the flow of a gas at a desired pressure. The second cavity 20b is hermetically sealed by the second and third bonding regions 14b, 14c as well as the additional structure of the combined MEMS device, such that the second cavity 20b maintains the higher pressure from the previous manufacturing steps and is not impacted by adjusting the pressure in the first cavity 20a through the access channel 22.

Figure 1E:
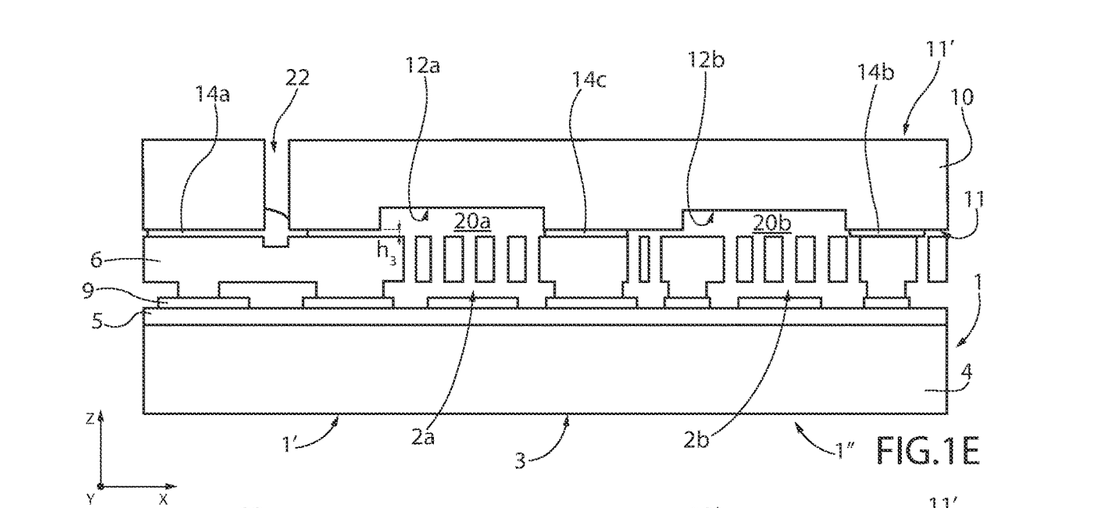

As shown in FIG. 1E, a second bonding phase is then performed, at a controlled pressure having a second value $P_2$, which corresponds for example to the desired operating pressure for the first microelectromechanical structure 2a. In an embodiment, the second value $P_2$ is less than the first value $P_1$ and corresponds to a reduced pressure, suitable for the operation of the gyroscope, for example of the order of a few mBar, for example equal to 1 mBar. However, the second pressure $P_2$ is equal to or greater than the first pressure $P_1$ in some embodiments, depending on the desired operating conditions of the microelectromechanical structures 2a, 2b.

This second bonding phase entails a further deformation, in particular by flattening or squishing (height reduction and widening) of the bonding region 14, due to the reflow of the bonding material. As a result of the second bonding phase in FIG. 1E, the bonding region 14 assumes a fourth or final height $h_3$, less than the intermediate height $h_2$, between the cap 10 and the structural layer 6 of the die 1. The final height $h_3$ is less than the intermediate height $h_2$ because the stopper element 16 is removed in previous processing steps and no longer prevents the cap 10 from moving closer to the structural layer 6 than the separation height $h_s$. The second bonding phase, despite deforming the bonding region 14, does not impact the pressure in the second cavity 20b, which remains hermetically sealed during the second bonding phase. In some embodiments, the reduction in volume of the second cavity 20b from the second bonding phase via flattening of the bonding region 14 may produce a negligible increase in pressure in the second cavity 20b, although it is expected that any increases will not impact operation of the combined MEMS device.

In particular, according to a particular aspect of the present solution, the bonding region 14 (more specifically the corresponding first bonding portion 14a) extends laterally below the access channel 22 and beyond the same access channel 22 towards the first cavity 20a, thereby closing the access channel 22 at the bottom and hermetically sealing the same first cavity 20a with respect to the external environment at the second pressure $P_2$. Thus, in the second bonding phase, the same first bonding region 14a is reflowed to extend beyond, and seal, the access channel 22. In an embodiment, the first bonding region 14a terminates before reaching the first cavity 20a to prevent the first bonding region 14a from interfering with the operation of the first microelectromechanical structure 2a. The extension of the first bonding region 14a during the bonding phases can be controlled according to various factors, including but not limited to the amount and type of bonding material, the pressure during each bonding phase, as well as the length of time of each bonding phase.

Figure 2:
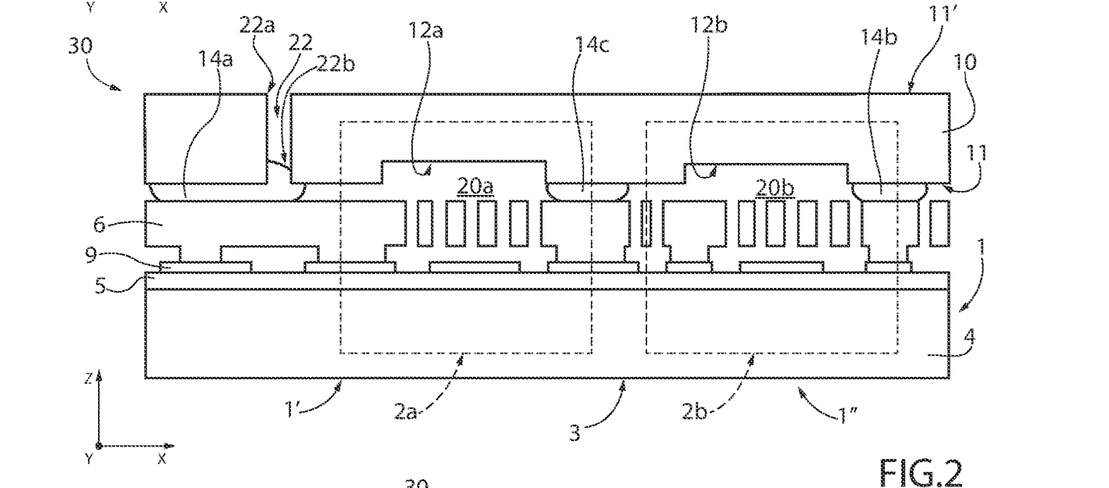
FIG. 2 is a schematic cross-sectional view of an embodiment of the combined microelectromechanical device resulting from the manufacturing process according to the present disclosure.

In sum, at the end of the aforementioned second bonding phase, the resulting combined MEMS device 30, illustrated in FIG. 2, is thus obtained (it should be noted that in this FIG. 2 the indentation 25 is not shown, by way of example).

Therefore, in this combined MEMS device 30, the first and the second microelectromechanical structures 2a, 2b are advantageously provided, with the respective first and second cavities 20a, 20b hermetically closed and set respectively to the first and the second pressures $P_1$, $P_2$, having different and optimized values for the respective operation of the same first and second microelectromechanical structures 2a, 2b.

In particular, in the combined MEMS device 30, the access channel 22 is provided through the cap 10, arranged laterally and externally with respect to the first microelectromechanical structure 2a, with a first end 22a open to the outside of the combined MEMS device 30 and a second end 22b, opposite to the first end 22a along the vertical axis Z, closed by the first bonding portion 14a of the bonding region 14, which bonds the cap 10 to the die 1 wherein the same first and second microelectromechanical structures 2a, 2b are formed.

In other words, the aforementioned first bonding portion 14a of the bonding region 14 therefore extends below the cap 10, so as to go beyond the aforementioned access channel 22, extending towards the first cavity 20a.

The advantages of the present solution are clear from the foregoing description.

In any case, it is underlined that the present solution is inexpensive to manufacture, since it does not utilize additional complex and expensive process steps to obtain the hermetic cavities at different pressures of the microelectromechanical structures of the combined MEMS device.

As previously discussed in detail, the present solution provides for a bonding process (in particular, by glass frit bonding) divided into two different phases. A first phase of the bonding process provides for bonding the cap and the sensor die with a controlled final thickness of the bonding region therebetween (obtainable by controlling the amount of bonding material and/or the bonding pressure and/or using a stopper element). The second phase of the bonding process is performed following the definition of the access channel at one of the cavities (for example the one of the gyroscope), allowing control of the pressure in this cavity and provides, at the end of the same second phase, the hermetic closure of the access channel exploiting the same bonding material (which, due to its flattening, closes the opening of the access channel at the bottom).

It is therefore highlighted that the process utilizes a single bonding process (divided into two distinct phases), without therefore requiring special or additional processing associated with conventional combined MEMS devices.

Figure 3:
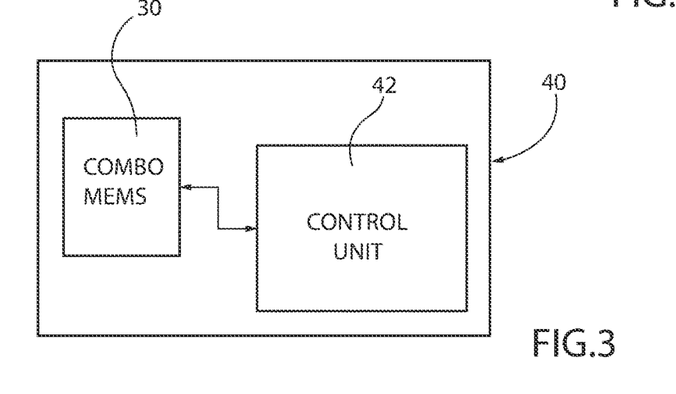
FIG. 3 is a schematic block diagram of an embodiment of an electronic apparatus including the combined microelectromechanical device of the present disclosure.

The solution discussed is advantageously applied in an electronic apparatus, for example of portable type (such as a smartphone, a tablet, a smartwatch), as shown schematically in FIG. 3.

The electronic apparatus, indicated with 40, thus comprises the combined MEMS device 30, acting for example as an inertial measuring unit, and a control unit 42, operatively coupled to the combined MEMS device 30 and configured to receive detection signals provided by the same combined MEMS device 30, for controlling the general operation of the electronic apparatus 40.

Finally, it is clear that modifications and variations may be made to what has been described and illustrated without thereby departing from the scope of the present invention, as defined in the attached claims.

In particular, it is underlined that the discussed solution may find advantageous application in all MEMS devices with at least two structures having respective distinct hermetic cavities where a different pressure value is advantageous (for example, in the case of combined MEMS devices including two accelerometers or two gyroscopes or any other hermetic-cavity structures, e.g., a microphone or a pressure sensor).

Furthermore, in a possible embodiment, the first value $P_1$ of the controlled pressure in the first bonding phase might alternatively be greater than the second value $P_2$ of the controlled pressure in the second bonding phase (in case the pressure inside the first cavity 20a should be lower than the pressure inside the second cavity 20b).

As previously discussed, it is again underlined that the stopper element 16 might not be used in the manufacturing process, for example in case the thickness of the bonding region 14 is controlled exclusively by controlling the amount of material and/or the bonding pressure.

Furthermore, the etching for forming the access channel 22 might not lead to the definition of the indentation 25 (which would therefore not be present in the final MEMS device, as illustrated on the other hand in the example of FIG. 2), for example in case of a previous definition of an etch stop layer on the surface of the structural layer 6 facing the cap 10, below the same access channel 22.

One or more embodiments of a process for manufacturing a combined microelectromechanical device (30) may be summarized as including: forming in a die (1) of semiconductor material at least a first (2a) and a second (2b) microelectromechanical structures; bonding a cap (10) to the die (1) by means of a bonding region (14), so as to define at least a first (20a) and a second (20b) cavity, at said first and, respectively, second microelectromechanical structures; forming an access channel (22) through said cap (10) in fluidic communication with the first cavity (20a) so as to control the pressure value inside said first cavity (20a) in a distinct manner with respect to a respective pressure value inside said second cavity (20b); hermetically closing said first cavity (20a) with respect to said access channel (22), the bonding including implementing, prior to forming said access channel (22), a first bonding phase, at a controlled pressure having a first value ($P_1$), being a function of the pressure value inside said second cavity (20b), implementing, after forming said access channel (22), a second bonding phase, at a respective controlled pressure having a second value ($P_2$), being a function of the pressure value inside said first cavity (20a), wherein, due to said second bonding phase, the bonding region (14) deforms to hermetically close said first cavity (20a) with respect to said access channel (22).

The process may further include: the first bonding phase including a squishing of the bonding region (14), which assumes an intermediate height ($h_2$) less than an initial height ($h_1$); and said second bonding phase may entail a further squishing of the bonding region (14), which assumes a final height ($h_3$) less than said intermediate height ($h_2$) and further extends laterally below the access channel (22) and beyond the access channel (22) towards the first cavity (20a), thereby closing the access channel (22) at the bottom and hermetically sealing said first cavity (20a).

The process may further include: the bonding region (14) including a first bonding portion (14a) arranged externally with respect, and in proximity, to the first detection structure (2a) and forming an access channel (22) through said cap (10) may include performing an etching throughout the thickness of the cap (10) in proximity to said first bonding portion (14a); and said second bonding phase entails the further squishing of said first bonding portion (14a) for the hermetic closure of said first cavity (20a).

The process may further include: the cap (10) including a spacer element (16) extending from a facing surface (11) of the cap (10), facing the die (1), towards said die (1), arranged in proximity to the first bonding portion (14a) of the bonding region (14) and having a separation height ($h_s$); and, in said first bonding phase, said spacer element (16) determines the intermediate height ($h_2$) of said bonding region (14), said intermediate height ($h_2$) being equal to said separation height ($h_s$).

The process may further include: the etching for forming said access channel (22) completely removing said spacer element (16); the etching stopping in a structural layer (6) of said die (1) facing said cap (10), forming an indentation (25) therein; the bonding region (14) including glass frit material; the first microelectromechanical structure (2a) defining a gyroscopic sensor and said second microelectromechanical structure (2b) defining an accelerometric sensor; wherein said first value ($P_1$), corresponding to the controlled pressure in the first cavity (20a) associated with the gyroscopic sensor, may be lower than said second value ($P_2$), corresponding to the controlled pressure in the second cavity (20b) associated with the accelerometric sensor.

The process may further include: the bonding region (14) including a first (14a) and a second (14b) bonding portions, arranged externally with respect, and in proximity, to the first (2a), respectively second (2b), detection structures, and a third bonding portion (14c) arranged at a separation portion (3) of the die (1) which separates said first and second detection structures; and wherein said first cavity (20a) may be laterally delimited by the first and the third bonding portions (14a, 14c) of the bonding region (14) and may include a first recess (12a) formed in the cap (10) starting from a facing surface (11) facing said die (1); and said second cavity (20b) may be laterally delimited by the second and the third bonding portions (14b, 14c) of the bonding region (14) and may include a second recess (12b) formed in the cap (10) starting from said facing surface (11) facing the die (1).

A combined microelectromechanical device (30) may be summarized as including: a die (1) of semiconductor material, accommodating at least a first (2a) and a second (2b) microelectromechanical structures; a cap (10), bonded to the die (1) by means of a bonding region (14) and defining at least a first (20a) and a second (20b) cavity at said first and, respectively, second microelectromechanical structures, wherein said first cavity (20a) has, therein, a controlled pressure value different from a respective controlled pressure value inside said second cavity (20b); and an access channel (22) through said cap (10), in proximity to said first cavity (20a), said first cavity (20a) being hermetically closed with respect to said access channel (22), said access channel (22) having a first end (22a) open to an environment external to the combined MEMS device (30) and a second end (22b), opposite to the first end (22a), closed by a first bonding portion (14a) of said bonding region (14).

The device may further include: the first bonding portion (14a) of the bonding region (14) extending laterally below the access channel (22) and beyond the same access channel (22) towards the first cavity (20a), thereby closing the access channel (22) at the bottom and hermetically sealing said first cavity (20a); and the first bonding portion (14a) of said bonding region (14) arranged externally with respect, and in proximity, to the first detection structure (2a); and said bonding region (14) may further include a second bonding portion (14b), arranged externally with respect, and in proximity, to the second detection structure (2b), and a third bonding portion (14c) arranged at a separation portion (3) of the die (1), which separates said first and second detection structures; and said first cavity (20a) may be laterally delimited by the first and the third bonding portions (14a, 14c) of the bonding region (14) and may include a first recess (12a) formed in the cap (10) starting from a facing surface (11) facing said die (1); and said second cavity (20b) may be laterally delimited by the second and the third bonding portions (14b, 14c) of the bonding region (14) and may include a second recess (12b) formed in the cap (10) starting from said facing surface (11) facing the die (1).

The device may further include: the first microelectromechanical structure (2a) defining a gyroscopic sensor and said second microelectromechanical structure (2b) defining an accelerometric sensor; wherein the controlled pressure in the first cavity (20a) associated with the gyroscopic sensor has a first value ($P_1$), lower than a second value ($P_2$) of the controlled pressure in the second cavity (20b) associated with the accelerometric sensor; the bonding region (14) including glass frit material; and the access channel (22) arranged laterally and externally with respect to the first microelectromechanical structure (2a).

One or more embodiments of an electronic apparatus (40), may be summarized as including the combined microelectromechanical device (30), and a control unit (42) operatively coupled to said combined microelectromechanical device (30).

One or more embodiments of a combined microelectromechanical device may be summarized as including: a first microelectromechanical structure on a die; a second microelectromechanical structure on the die; a cap coupled to the die; an adhesive between the cap and the die, the adhesive including a first adhesive portion, a second adhesive portion, and a third adhesive portion; a first cavity defined at least in part by the cap, the first adhesive portion, and the third adhesive portion, the first cavity corresponding to the first microelectromechanical structure and having a first pressure value inside the first cavity; a second cavity defined at least in part by the cap, the second adhesive portion and the third adhesive portion, the second cavity corresponding to the second microelectromechanical structure and having a second pressure value inside the second cavity different from the first pressure value; and an access channel through the cap, both the first cavity and the second cavity being hermetically sealed with respect to the access channel, the access channel having a first open end and a second end opposite to the first end, the second end of the access channel sealed by one of the first adhesive portion and the second adhesive portion of the adhesive.

The combined microelectromechanical device may further include: the access channel being proximate the first cavity with the second end of the access channel sealed by the first adhesive portion of the adhesive; the second end of the access channel being sealed by the first adhesive portion, the first adhesive portion extending laterally across, and beyond, the second end of the access channel and terminating before the first cavity; the first microelectromechanical structure being a gyroscope and the second microelectromechanical being an accelerometer, the first pressure value being less than the second pressure value; and the cap including a first recess and a second recess in a surface of the cap facing the die, the first cavity defined at least in part by the first recess and the second cavity defined at least in part by the second cavity.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a combined microelectromechanical device, comprising:
   bonding a cap to a die with an adhesive, including forming a first cavity and a second cavity corresponding, respectively, to a first microelectromechanical structure and a second microelectromechanical structure in the die;
   forming an access channel through the cap in fluidic communication with the first cavity;
   controlling a pressure value inside the first cavity distinct from a pressure value inside the second cavity; and
   hermetically closing the first cavity with respect to the access channel,
   bonding the cap to the die including:
      implementing, prior to forming the access channel, a first bonding phase at a controlled pressure having a first value corresponding to the pressure value inside the second cavity; and
      implementing, after forming the access channel, a second bonding phase at a controlled pressure having a second value corresponding to the pressure value inside the first cavity, including the adhesive deforming during the second bonding phase to hermetically seal the first cavity with respect to the access channel.

2. The process according to claim 1 wherein the first bonding phase includes flattening the adhesive from an initial height to an intermediate height less than the initial height, and wherein the second bonding phase includes a further flattening of the adhesive from the intermediate height to a final height less than the intermediate height,
   the second bonding phase further including flowing the adhesive laterally below the access channel and beyond the access channel towards the first cavity, thereby closing the access channel at a bottom of the access channel and hermetically sealing the first cavity with the adhesive.

3. The process according to claim 2 wherein bonding the cap to the die with the adhesive includes forming the adhesive with a first adhesive portion arranged externally with respect to, and in proximity with, the first microelectromechanical structure, and
  wherein forming the access channel through the cap includes etching through an entire thickness of the cap in proximity to the first adhesive portion, and
  wherein the second bonding phase includes the further flattening of the first adhesive portion for the hermetic closure of the first cavity.

4. The process according to claim 3 wherein bonding the cap to the die with the adhesive includes forming a spacer extending from a surface of the cap facing the die towards the die, the spacer arranged in proximity to the first adhesive portion and having a separation height, and
  wherein the first bonding phase further includes determining the intermediate height of the adhesive with the spacer, the intermediate height being equal to the separation height of the spacer.

5. The process according to claim 4 wherein forming the access channel includes completely removing the spacer.

6. The process according to claim 5 wherein forming the access channel includes etching the access channel, etching the access channel including terminating the etching in a structural layer of the die facing the cap and forming an indentation in the structural layer.

7. The process according to claim 1 wherein bonding the cap to the die with the adhesive includes bonding the cap to the die with a glass frit material.

8. The process according to claim 1 wherein forming the first microelectromechanical structure includes defining a gyroscopic sensor and forming the second microelectromechanical structure includes defining an accelerometer, and
  wherein controlling the pressure value includes controlling the pressure value in the first cavity associated with the gyroscopic sensor to be lower than the pressure value in the second cavity associated with the accelerometer.

9. The process according to claim 1 wherein bonding the cap to the die with an adhesive includes:
  bonding a first adhesive portion and a second adhesive portion arranged externally with respect to, and in proximity with, the first microelectromechanical structure and the second microelectromechanical structure, respectively; and
  bonding a third adhesive portion at a separation portion of the die separating the first microelectromechanical structure and the second microelectromechanical structure, and
  wherein defining the first cavity includes defining the first cavity to be laterally delimited by the first and the third adhesive portions of the adhesive and forming a first recess in a surface of the cap facing the die, and
  wherein defining the second cavity includes defining the second cavity to be laterally delimited by the second and the third adhesive portions of the adhesive and forming a second recess in the surface of the cap facing the die.

10. A method, comprising:
  coupling a cap to a substrate with adhesive, the coupling of the cap to the substrate including forming a first cavity for a first microelectromechanical structure in the substrate and forming a second cavity for a second microelectromechanical structure in the substrate, the cap including a protrusion extending from the cap to the substrate;
  setting a first pressure value in the second cavity;
  moving the cap and the substrate closer to each other such that the protrusion contacts the substrate;
  forming an access channel through the cap, the forming of the access channel includes removing the protrusion from the cap;
  setting a second pressure value, which is different from the first pressure value, in the first cavity; and
  moving the cap and the substrate closer to each other such that a first portion of the adhesive extends into the access channel.

11. The method of claim 10 wherein the protrusion is spaced from the second cavity by the first cavity.

12. The method of claim 10 wherein the first microelectromechanical structure is a gyroscopic sensor, the second microelectromechanical structure is an accelerometer, and the second pressure value is less than the first pressure value.

13. The method of claim 10 wherein the adhesive includes glass frit material.

14. The method of claim 10 wherein the first microelectromechanical structure is positioned between the first portion and a second portion of the adhesive, and the second microelectromechanical structure is positioned between the second portion and a third portion of the adhesive.

15. The method of claim 10 wherein the forming of the access channel includes fluidically coupling the access channel to the first cavity.

16. A method, comprising:
  forming a first microelectromechanical structure on a die;
  forming a second microelectromechanical structure on the die;
  coupling a cap to the die with adhesive,
    the adhesive including a first adhesive portion, a second adhesive portion, and a third adhesive portion,
    the coupling of the cap to the die including forming a first cavity corresponding to the first microelectromechanical structure and a second cavity corresponding to the second microelectromechanical structure,
    the first cavity being defined at least in part by the cap, the first adhesive portion, and the second adhesive portion;
    the second cavity being defined at least in part by the cap, the second adhesive portion, and the third adhesive portion; and
  forming an access channel through the cap,
    the access channel having a first end and a second end opposite to the first end,
    the second end of the access channel sealed by the first adhesive portion,
    the first cavity and the second cavity being hermetically sealed with respect to the access channel,
    the first cavity having a first pressure value inside the first cavity,
    the second cavity having a second pressure value different from the first pressure value inside the second cavity.

17. The method of claim 16 wherein the access channel is spaced from the second cavity by the first cavity.

18. The method of claim 16 wherein the first adhesive portion extends laterally across, and beyond, the second end of the access channel and terminating before the first cavity.

19. The method of claim 16 wherein the first microelectromechanical structure is a gyroscope, the second microelectromechanical structure is an accelerometer, and the first pressure value is less than the second pressure value.

20. The method of claim 16 wherein the cap includes a first recess and a second recess in a surface of the cap facing the die, the first cavity is defined at least in part by the first recess, and the second cavity is defined at least in part by the second cavity.

\* \* \* \* \*